United States Patent [19]
Tabuchi et al.

[11] Patent Number: 5,330,862
[45] Date of Patent: Jul. 19, 1994

[54] METHOD FOR FORMING RESIST MASK PATTERN BY LIGHT EXPOSURE HAVING A PHASE SHIFTER PATTERN COMPRISING CONVEX FORMS IN THE RESIST

[75] Inventors: Hiroki Tabuchi, Nara; Katsuji Iguchi, Yamatokoriyama; Makoto Tanigawa, Kitakatsuragi; Takayuki Taniguchi, Tenri; Hiroyuki Moriwaki, Nara, all of Japan

[73] Assignee: Sharp Kabushiki Kaisha, Osaka, Japan

[21] Appl. No.: 874,809

[22] Filed: Apr. 28, 1992

[30] Foreign Application Priority Data

Jun. 7, 1991 [JP] Japan .................. 3-136799
Dec. 6, 1991 [JP] Japan .................. 3-323442

[51] Int. Cl.$^5$ .............................. G03F 9/00
[52] U.S. Cl. ........................ 430/5; 430/322; 430/326
[58] Field of Search .............. 430/5, 22, 269, 311, 430/321, 322, 326

[56] References Cited

U.S. PATENT DOCUMENTS 5,015,559  1/1992  Ogawa .................. 430/326

OTHER PUBLICATIONS

Patent Abstracts of Japan vol. 16, No. 65 (P-1313) Feb. 18, 1992 & JP-A-3 259 257 (Mitsubishi Electric Corp.) Nov. 19, 1991.
Patent Abstracts of Japan vol. 16, No. 19 (P-1300) Jan. 17, 1992 & JP-A-3 237 458 (Mitsubishi Electric Corp.) Oct. 23, 1991.
Patent Abstracts of Japan vol. 5, No. 110 (P-71) Jul. 17, 1981 & JP A-56 051 738 (Oki Electric Inc. Co. Ltd.) May 9, 1981.
Patent Abstracts of Japan vol. 13, No. 268 (E-775) Jun. 20, 1989 & JP-A-1 059 884 (Fujitsu Ltd.) Mar. 7, 1989.

Primary Examiner—Steve Rosasco
Attorney, Agent, or Firm—Nixon & Vanderhye

[57] ABSTRACT

A method for forming a resist mask pattern by light exposure providing the steps of forming a resist layer on a semiconductor substrate, forming a phase shifter pattern for inverting a phase of exposed light in an upper portion of the resist layer itself or over the surface of the resist layer, exposing the surface of the semiconductor substrate including the phase shifter pattern, and forming a fine mask pattern below the edge of the phase shifter pattern.

8 Claims, 8 Drawing Sheets

Light intensity on α plane

Ideal phase on β plane

Actual phase on β plane

Light intensity on β plane

METHOD FOR FORMING RESIST MASK PATTERN BY LIGHT EXPOSURE HAVING A PHASE SHIFTER PATTERN COMPRISING CONVEX FORMS IN THE RESIST

BACKGROUND OF THE INVENTION

1. Field of the Invention

The present invention relates to a method for forming a resist mask pattern by light exposure which is to be used for manufacturing a semiconductor device or the like.

2. Description of the Prior Art

Referring to VLSI semiconductor devices which have recently been manufactured, a lot of transistors and wires are integrated in the order of submicron size on a silicon substrate. There has been used a light exposure technology in which a mask pattern is reduced (generally, by one fifth) and transferred to a photosensitive resin (resist) film which is provided on the silicon substrate so as to form a pattern of submicron size.

The minimum line widths of 1 Mbit and 4 Mbit DRAMs which have been mass-produced are set to 1.2 $\mu$m and 0.8 $\mu$m, respectively. Most exposure devices (steppers) for producing the 1 Mbit and 4 Mbit DRAMs utilize a bright line having a wavelength of 436 nm which is called a g-line and is emitted from an extra-high pressure mercury lamp. In some cases, there has been utilized a bright line having a wavelength of 365 nm which is called an i-line and is emitted from the extra-high pressure mercury lamp.

Referring to 16 Mbit and 64 Mbit DRAMS which will be produced in the future, it is expected that the minimum line widths will be set 0.6 to 0.5 $\mu$m and 0.4 to 0.3 $\mu$m. It is necessary to form resist masks having the minimum line widths so as to mass-produce the above-mentioned semiconductor devices. Consequently, it is required that a light exposure technology having higher resolution should be developed. It has been examined whether the i-line and EKISHIMA laser using krypton and fluorine which has a wavelength of 248 nm are utilized in place of the g-line so as to improve resolution by causing exposed light to have a smaller wavelength.

Referring to the exposure technology in which the exposure devices are utilized, however, the contrast of an optical image on the silicon substrate is deteriorated by the diffraction of light on pattern ends when a pattern size approximates a wavelength size. The resolution is much lower than threshold resolution as determined by an exposure wavelength and a numerical aperture NA of a lens provided on the exposure device.

To eliminate the above-mentioned drawbacks, there has been proposed a phase shifting method for inverting the phase of exposed light so as to improve the contrast of an optical image. The phase shifting method has been utilized exclusively for a mask technology.

By the phase shifting method, a pattern structure on a mask can be improved so as to enhance the contrast of the optical image and practical resolution. For this technology, there is used a mask which is called a phase shifting mask.

An example of the phase shifting mask is shown in FIG. 24. The reference numeral 41 denotes a quartz substrate transparent for an exposure wavelength. The reference numeral 43 denotes a thin chromium film which intercepts exposed light. The reference numeral 42 denotes a thin film (phase shifting film) transparent for the exposed light and having a thickness Ts. The thickness Ts has the following relationship with a refractive index n and a wavelength $\lambda$ of the exposed light.

$$Ts = \lambda / \{2 \cdot (n-1)\} \quad (1)$$

The above-mentioned condition is set such that the phase of exposed light transmitted through the thin film 42 is shifted by a half wavelength (180 degrees). An aperture 49 always corresponds to the aperture of the mask. On the phase shifting mask are provided small apertures 40 along with the phase shifting films 42. The aperture 40 is not singly resolved therearound.

Referring to the phase shifting mask shown in FIG. 24, the phase of light transmitted through the aperture 49 is different from that of light transmitted through the apertures 40 by 180 degrees. Consequently, a light wave diffracted from the aperture 49 to its peripheral portion and a light wave from the apertures 40 cancel each other. As a result, light overflow can be controlled from the aperture 49 to its peripheral portion on an imaging plane so that the contrast of a projected image can be improved. Thus, the contrast of an image projected onto a resist is improved so that practical resolution can be enhanced. However, it is necessary to draw a first resist image for forming a chromium pattern and then draw a second resist image for specifying a phase shifting film by means of an exposure device using electron beams in order to fabricate the phase shifting mask shown in FIG. 24. It is required that electron beam drawing which takes a lot of time should be carried out twice. In addition, it is necessary to superpose a second pattern on a first pattern with high precision. Consequently, it is more difficult to fabricate the mask on a technical basis and costs are increased.

To solve the above-mentioned problems, there has been proposed a phase shifting mask shown in FIG. 25. The reference numeral 51 denotes a quartz substrate transparent for an exposure wavelength. The reference numeral 53 denotes a thin chromium film which intercepts exposed light. The reference numeral 52 denotes a resist film as a phase shifting film, of which film thickness Ts satisfies the formula (1) described above. The phase shifting mask is fabricated as follows. First, an aperture 59 is formed by a resist (not shown) by means of an exposure device using electron beams. Then, the chromium film 53 on the aperture 59 is removed by etching. Thereafter, the resist film 52 is provided as the phase shifting film and is exposed by far ultraviolet rays from the transparent substrate 51 side by using the chromium film 53 as a mask. Consequently, the aperture 59 is formed on the phase shifting film 52. Subsequently, the chromium film 53 provided under the phase shifting film 52 is etched so that an aperture 54 of the chromium film 53 is made larger than the aperture 59 of the phase shifting film 52. Consequently, there is formed an area 50 which is covered by the resist film 52 around the chromium film 53. The phase of light transmitted through the aperture 59 is different from that of light transmitted through the area 50 by 180 degrees. When the transmitted light are superposed, they cancel each other. Consequently, light overflow can be controlled from the aperture 59 to its peripheral portion. Accordingly, the distribution of light intensities on an image forming plane is made very sharp so that practical resolution can be enhanced. Referring to this method, the frequency of drawing executed by the exposure device using electron beams is not increased and the process of fabricating the mask is complicated. The resist film which remains as the phase shifting film is fragile so that it is difficult to carry out cleaning for removing refuse on the mask. Consequently, the above-mentioned method is of no practical use.

As described above, the phase shifting methods which have been proposed can be used for only a mask technique. The process of fabricating a mask is complicated. In addition, there is a great problem in respect of practicality. Consequently, it is desired that a technique for applying and using the phase shifting method should become more effective and simple.

SUMMARY OF THE INVENTION

The present invention provides a method for forming a resist mask pattern by light exposure comprising the steps of forming a resist layer on a semiconductor substrate, forming a phase shifter pattern for inverting a phase of exposed light in an upper portion of the resist layer itself or over the surface of the resist layer, exposing the surface of the semiconductor substrate including the phase shifter pattern, and forming a fine mask pattern below the edge of the phase shifter pattern.

PREFERRED EMBODIMENT

The present invention provides a method for forming a resist mask pattern by light exposure comprising the steps of forming a resist layer on a semiconductor substrate, forming a phase shifter pattern for inverting a phase of exposed light in an upper portion of the resist layer itself or over the surface of the resist layer, exposing the surface of the semiconductor substrate including the phase shifter pattern, and forming a fine mask pattern below the edge of the phase shifter pattern. The thickness of the phase shifter pattern should satisfy the above-mentioned formula (1).

Figure 1:
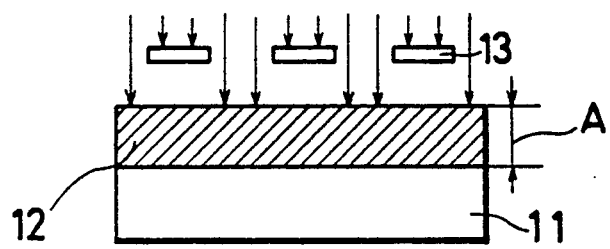
FIG. 1 is a view showing a first step of a manufacturing process according to a first embodiment of the present invention.
Figure 2:
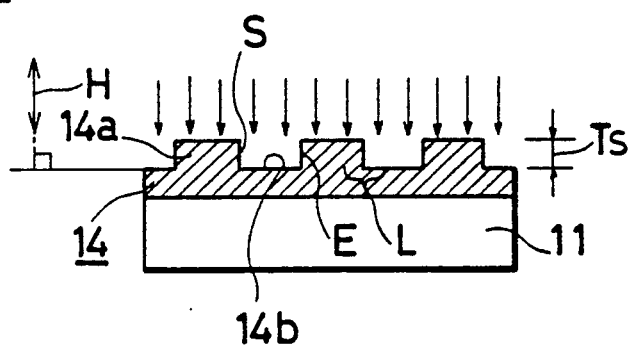
FIG. 2 is a view showing a second step of the manufacturing process according to the first embodiment of the present invention.
Figure 5:
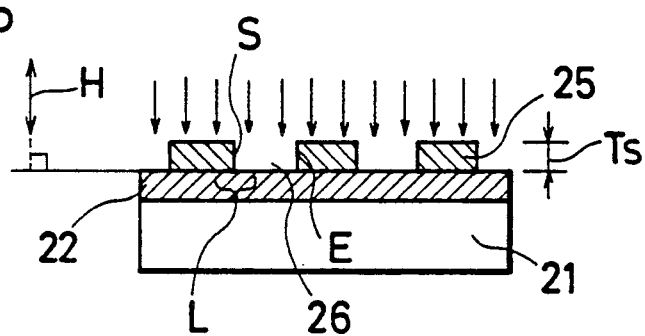
FIG. 5 is a view showing a second step of the manufacturing process according to the second embodiment of the present invention.
Figure 8:
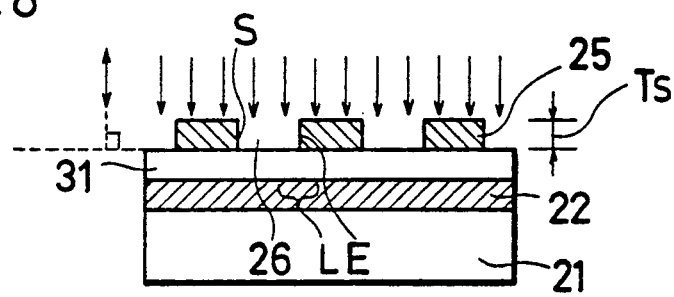
FIG. 8 is a view showing a second step of the manufacturing process according to the third embodiment of the present invention.
Figure 12:
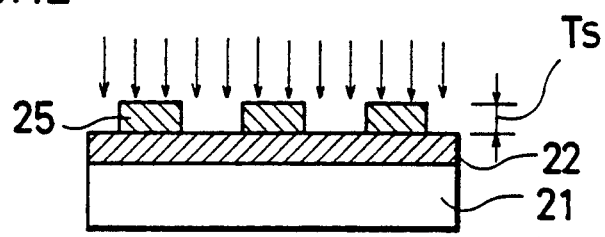
FIG. 12 is a view showing a third step of the manufacturing process according to the fourth embodiment of the present invention.
Figure 13:
FIG. 13 is a view showing a fourth step of the manufacturing process according to the fourth embodiment of the present invention.
Figure 14:
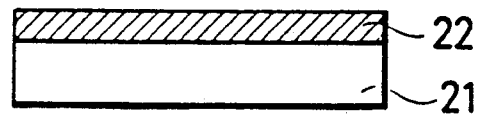
FIG. 14 is a view showing a first step of a manufacturing process according to a fifth embodiment of the present invention.
Figure 15:
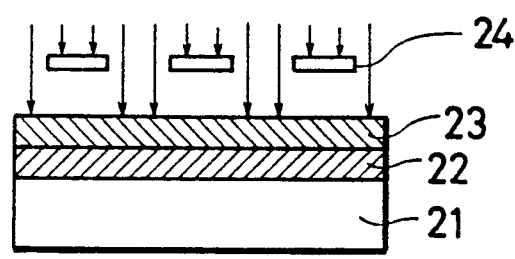
FIG. 15 is a view showing a second step of the manufacturing process according to the fifth embodiment of the present invention.
Figure 16:
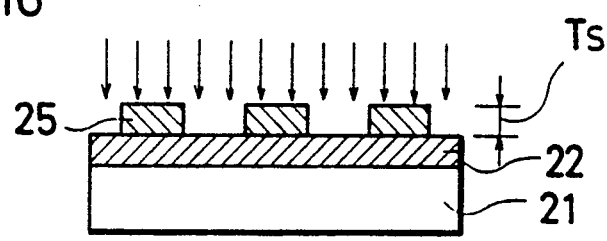
FIG. 16 is a view showing a third step of the manufacturing process according to the fifth embodiment of the present invention.
Figure 17:
FIG. 17 is a view showing a fourth step of the manufacturing process according to the fifth embodiment of the present invention.

According to the present invention, it includes the phase shifter pattern formed as follows:

(a) a phase shifter pattern 14a is formed in the upper portions of resist layers 12 and 14 as shown in FIGS. 1 and 2;

(b) a phase shifter pattern 25 is formed on the top face of a resist layer 22 as shown in FIGS. 5, 12 and 16; and (c) the phase shifter pattern 25 is formed above the resist layer 22 through an intermediate layer 31 as shown in FIG. 8.

In the cases where (i) a phase shifter pattern is formed and (ii) a fine resist mask pattern is formed on a semiconductor substrate having the phase shifter pattern by utilizing phase shifting effects, exposure is carried out.

Figure 3:
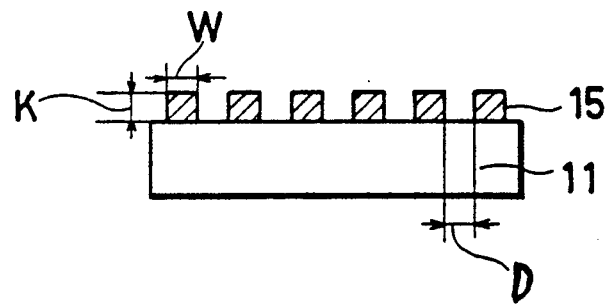
FIG. 3 is a view showing a third step of the manufacturing process according to the first embodiment of the present invention.

According to a first embodiment of the present invention shown in FIGS. 1 to 3, when the resist layer 12 is formed at a thickness of 1.2 $\mu$m, an exposure in the case (i) is preferably 60 to 80% of a threshold exposure (the time for exposure: 200 msec), more preferably 70% of the threshold exposure (the time for exposure: 140 msec).

It is proper that the time for exposure is about 140 msec in the case (ii).

Also in the case where a KrF laser is used, it is preferred that the exposure in the case (i) is 70% of the threshold exposure.

According to second to fifth embodiments of the present invention, exposure is carried out at a quantity corresponding to the thickness of a resist layer or a thin film that is transparent for exposed light as another resist layer. The resist layers are made of different materials.

In the case where specific conditions are set, the above-mentioned exposures are preferred. According to the first embodiment shown in FIGS. 1 to 3, the exposure in the case (i) greatly depends on the thickness of a convex portion 14a (see FIG. 2) determined by an exposure wavelength λ and a refractive index n of the resist layer 14, a resist sensitivity, the conditions of development and the like in the case (ii). When whole exposure is carried out in the case (ii), the fine resist mask pattern is finally obtained depending on an exposure. In this case, an interval D between the fine resists (see FIG. 3) can be controlled according to the exposure, and greatly depends on the resist sensitivity and the conditions of development.

There will be summarized the process of forming a fine resist mask pattern according to the first embodiment with reference to FIGS. 1 to 3.

As shown in FIG. 2, there is first formed a stage difference a of a convex portion 14a which satisfies the formula (1). Then, whole exposure is carried out. In this case, the phase of light transmitted through the convex portion 14a is inverted to be reverse to that of light transmitted through a concave portion 14b. Consequently, the amplitude of the light transmitted through the convex portion 14a and that of the light transmitted through the concave portion 14b cancel each other in a stage difference S portion (an edge portion E of the convex portion 14a). As a result, light intensity becomes zero (see FIG. 23). Accordingly, there is not exposed a resist in an area L on the lower part of the edge portion E. In case of a positive type resist, a pattern 15 is formed (see FIG. 3). The pattern 15 is a fine resist mask pattern.

Figure 18:
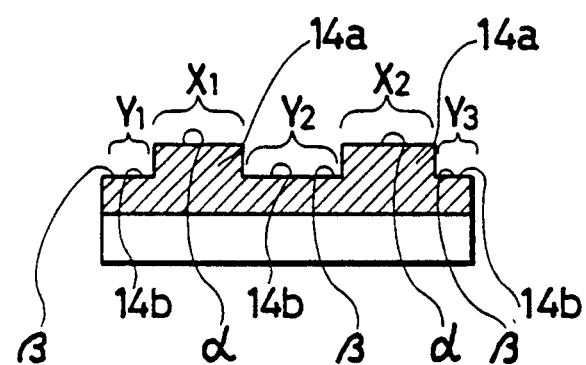
FIG. 18 is a view for explaining phase shifting effects obtained at the second step according to the first embodiment of the present invention.
Figure 19:
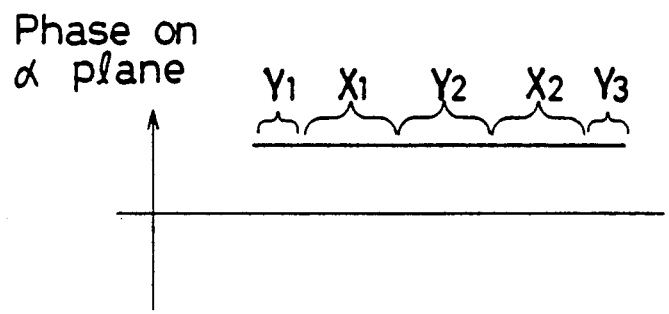
FIG. 19 is a view for explaining the phase of light on an $\alpha$ plane shown in FIG. 18 according to the first embodiment of the present invention.
Figure 20:
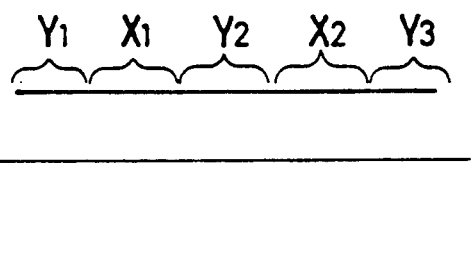
FIG. 20 is a view for explaining the intensity of light on the $\alpha$ plane shown in FIG. 18 according to the first embodiment of the present invention.
Figure 21:
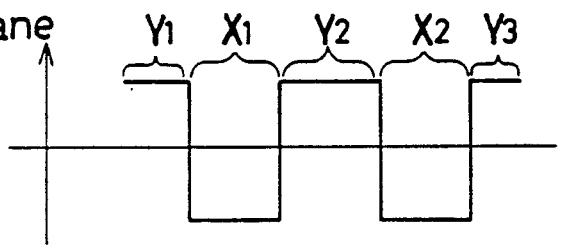
FIG. 21 is a view for explaining the ideal phase of light on a $\beta$ plane shown in FIG. 18 according to the first embodiment of the present invention.
Figure 22:
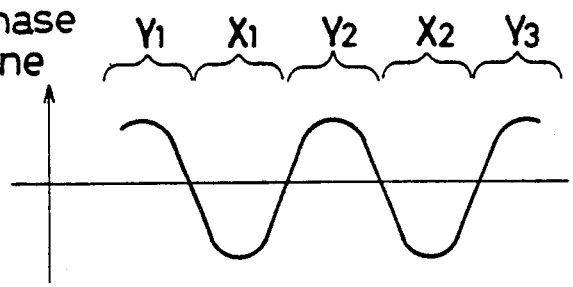
FIG. 22 is a view for explaining the actual phase of light on the $\beta$ plane shown in FIG. 18 according to the first embodiment of the present invention.
Figure 23:
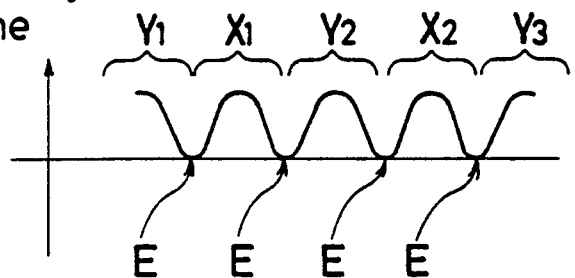
FIG. 23 is a view for explaining the intensity of light on an edge E and the $\beta$ plane shown in FIG. 18 according to the first embodiment of the present invention.
Figure 24:
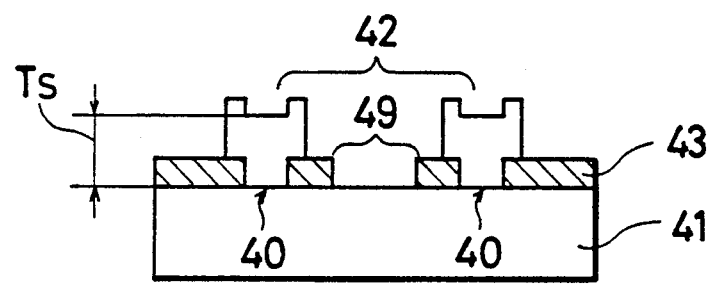
FIG. 24 is a view showing the structure of a phase shifting mask according to the prior art.
Figure 25:
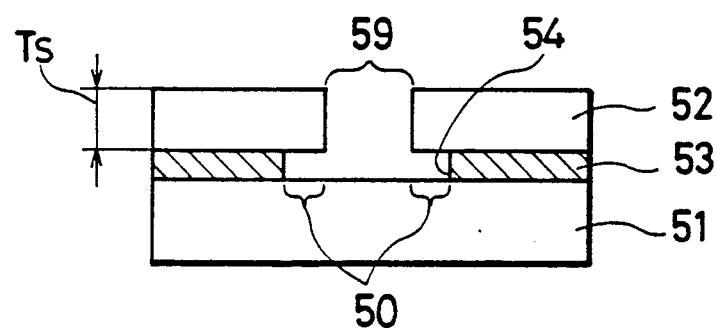
FIG. 25 is a view showing the structure of another phase shifting mask according to the prior art.

As shown in FIG. 18, the reference designations X1 and X2 denote surface areas of the convex portions 14a, and the reference designations Y1, Y2 and Y3 denote surface areas of the concave portions 14b. FIGS. 19 to 23 show the intensity and phase of light received by the surface areas X1, X2, Y1, Y2 and Y3 in the process of exposure according to the first embodiment. As seen from FIG. 22, the phase of the light transmitted through the convex portion 14a is inverted to be reverse to that of the light transmitted through the concave portion 14b. FIG. 23 shows a light intensity on a β plane shown in FIG. 18. As seen from FIG. 23, the amplitude of light is zero in the stage difference S portion so that the light intensity which is defined by a square of the amplitude becomes zero.

A positive type photoresist as a photosensitive resin is used for a resist layer according to the present invention. An example of the resist layer is a novolak resin-O-quinone diazide compound. In this case, a solution with a novolak resin-O-quinone diazide compound base is applied by a spin on method. Prebaking is carried out so that the resist layer is formed. Other examples of the resist layer are a PMMA (polymethyl methacrylate) and a negative type novolak resist. Even if the PMMA or negative type novolak resist is used, it is sufficient that prebaking is carried out in similar to the case where the novolak resin-O-quinone diazide compound is used.

According to the present invention, a phase shifter pattern for inverting the phase of exposed light is provided on the upper portion of the resist layer and whole exposure is carried out to form a fine resist mask pattern.

Referring to a first embodiment of the present invention, only the upper portion of the resist layer is partially patterned. A convex portion thus formed is a phase shifter pattern for inverting the phase of exposed light. Then, whole exposure is carried out so that a fine resist mask pattern is formed on the lower part of the edge of the convex portion by utilizing self-phase shifting effects of the resist layer having the convex portion.

In that case, the phase shifter pattern comprised of the concave and convex portions is formed by light exposure with the use of a mask.

Referring to a second embodiment of the present invention, a thin film pattern is laminated on a resist layer. The thin film pattern is another resist layer which is transparent for exposed light. Then, a transparent thin film pattern is formed as a phase shifter pattern for inverting the phase of the exposed light. Thereafter, whole exposure is carried out to form a fine resist mask pattern on the lower part of the edge of the phase shifter pattern by utilizing phase shifting effects.

In that case, the thin film pattern is formed by light exposure with the use of a mask. The thin film pattern is a phase shifter pattern for inverting the phase of exposed light and is transparent for the exposed light.

Referring to a third embodiment of the present invention, a thin film pattern is formed above a resist layer through an intermediate layer which is soluble in a developer of the resist layer and is transparent for exposed light. The thin film pattern thus formed is another resist layer which is transparent for the exposed light. Thereafter, whole exposure is carried out by using the transparent thin film pattern as the phase shifter pattern for inverting the phase of the exposed light. Consequently, a fine resist mask pattern is formed on the lower part of the edge of the transparent thin film pattern by utilizing phase shifting effects.

Referring to a fourth embodiment of the present invention, a resist layer is developed so that a resist layer surface is made insoluble in a developer. Consequently, a developer insoluble layer is formed. Then, a thin film pattern is formed as a phase shifter pattern on the developer insoluble layer. The thin film pattern is transparent for exposed light.

Referring to a fifth embodiment of the present invention, ultraviolet rays are radiated onto a resist layer so that a resist layer surface is made insoluble in a developer. Consequently, a developer insoluble layer is formed. Then, a thin film pattern is formed as a phase shifter pattern on the developer insoluble layer. The thin film pattern is transparent for exposed light.

First Embodiment

There will be described a first embodiment of the present invention with reference to FIGS. 1 to 3, in which only the upper portion of a resist layer 12 is partially removed, a residual resist layer surface is then formed to have concave and convex portions, and a convex portion 14a serves as a phase shifter pattern 14 for inverting the phase of exposed light.

As shown in FIG. 1, a Si semiconductor substrate 11 is subjected to a treatment for improving adhesion by using hexamethyl disilazane, i.e., a HMDS treatment. By using a spin on method, a positive type photoresist solution (with a novolak resin-O-quinone diazide compound base) is then applied onto the Si semiconductor substrate 11 thus treated. Prebaking is carried out to form a resist layer 12.

In that case, the prebaking is carried out for 60 sec at a temperature of 90° C. so that the resist layer 12 having a thickness A of 1.2 μm is formed.

Subsequently, the Si semiconductor substrate 11 is exposed for 140 msec (70 mJ/cm$^2$) which is not greater than a threshold exposure (Eth=200 msec) by means of an i-line ($\lambda$=365 nm) stepper having NA of 0.45 with the use of a mask 13 which is provided in a predetermined position above the resist layer 12 (see FIG. 1).

After the prebaking, development is carried out by using as a developer a diluted solution containing tetramethyl ammonium hydroxide [N(CH$_3$)$_4$OH], i.e., TMAH in a quantity of 2.38%. Then, the upper portion of the resist layer 12 is partially patterned to form a phase shifter pattern 14 having concave and convex portions (see FIG. 2).

In that case, a stage difference S is formed on the partial pattern 14. The stage difference S has a height Ts in a direction perpendicular to the convex portion 14a (in a direction of an arrow H). The height Ts of the stage difference S is determined by the following formula:

$$Ts=\lambda/\{2\cdot(n-1)\}$$

where $\lambda$ is an exposure wavelength and n is a refractive index of the resist layer. Since $\lambda$ is set to 365 nm and n is set to 1.68 in the present embodiment, Ts is 0.268 μm.

Then, the whole Si substrate 11 is exposed for 140 msec (70 mJ/cm$^2$) by means of the i-line stepper having NA of 0.45 with the use of the convex portion 14a of the partial pattern 14 as a phase shifter (see FIG. 2).

In that case, the phase of exposed light transmitted through the convex portion 14a is inverted to be reverse to that of exposed light transmitted through a concave portion1 14b. Consequently, the amplitude of the exposed light transmitted through the convex portion 14a and that of the exposed light transmitted through the concave portion 14b cancel each other on the edge E of the convex portion 14a, so that the intensity of the exposed light on the edge E becomes zero (see FIG. 23). Accordingly, there is not exposed a resist layer portion in the lower area L of the edge E of the convex portion 14a in which the light intensity is zero. The resist layer which is not exposed remains as a fine resist mask pattern in the next step.

After the prebaking, development is carried out for 60 sec by using as a developer a diluted solution containing TMAH in a quantity of 2.38% in similar to the formation of the partial pattern 14. Then, postbaking is carried out to form a fine resist mask pattern 15 on the Si semiconductor substrate 11 (see FIG. 3). The fine resist mask pattern 15 is comprised of a line which has a width W of 0.15 μm and a height K of 0.20 μm.

According to the prior art, the interval of a line which can be formed is 0.35 μm at the most. According to the present embodiment, there can be formed the finer resist mask pattern 15 having the line D of which width is 0.15 μm. Consequently, resolution can be enhanced by twice or more.

It is desired that the stage difference of the pattern having concave and convex portions formed by first exposure should satisfy the formula (1). A phase may vary from $(\frac{1}{2})\times\pi$ to $(3/2)\times\pi$. It is desired that the stage difference should be steep. Even if the stage difference has a slant, the pattern can be formed.

While the upper part of the resist portion comprised of a monolayer is used as a phase shifter pattern in the present embodiment, the phase shifter pattern may be formed by using a transparent thin film on the upper part of a resist portion having a two-layer structure which is formed by two different materials, as will be described in a second embodiment. The wavelengths of the former and latter exposed light may be different from each other.

Second Embodiment

Figure 4:
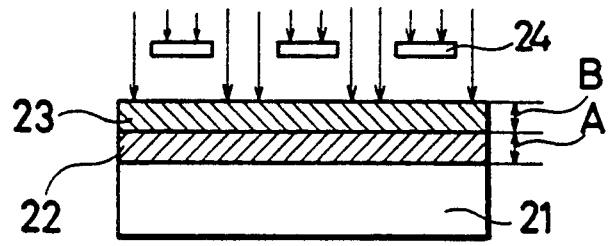
FIG. 4 is a view showing a first step of a manufacturing process according to a second embodiment of the present invention.
Figure 6:
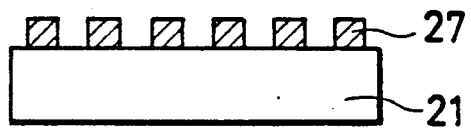
FIG. 6 is a view showing a third step of the manufacturing process according to the second embodiment of the present invention.

FIGS. 4 to 6 show a second embodiment of the present invention in which a thin film pattern 25 is formed on a resist layer 22 provided on a Si semiconductor substrate 21, the thin film pattern 25 being transparent for exposed light and serving as a phase shifter pattern for inverting the phase of the exposed light.

As shown in FIG. 4, the Si semiconductor substrate 21 is subjected to a HMDS treatment. By using a spin on method, a positive type photoresist layer is formed as a photosensitive resin on the Si semiconductor substrate 21 thus treated. Then, prebaking is carried out to form a resist layer 22.

In that case, the positive type photoresist is used as the photosensitive resin in similar to the first embodiment. A positive type photoresist ECA solution (with a novolak resin-O-quinone diazide compound base) is applied by the spin on method. The prebaking is then carried out for 60 sec at a temperature of 90° C. Consequently, the resist layer 22 is formed.

Subsequently, the spin on method is used and prebaking is then carried out to form a positive type photoresist layer as a photosensitive resin over the resist layer 22. The positive type photoresist layer thus formed is a transparent thin film 23 of which material is different from that of the resist layer 22 (see FIG. 4).

In that case, an ethyl lactate solution is applied by the spin on method and the prebaking is then carried out for 90 sec at a temperature of 60° C. Consequently, the transparent thin film 23 is formed as the photosensitive resin.

Subsequently, the Si semiconductor substrate 21 is exposed for 140 msec (70 mJ/cm$^2$) which is not greater than a threshold exposure (Eth=200 msec) by means of an i-line stepper having NA of 0.45 with the use of a mask 24 which is provided in a predetermined position above the transparent thin film 23 (see FIG. 4).

After the prebaking, development is carried out by using a diluted solution containing TMAH in a quantity of 2.38%. The transparent thin film 23 is patterned to form a transparent thin film pattern (phase shifter pattern) 25 (see FIG. 5).

In that case, a stage difference S is formed on the transparent thin film pattern 25. The stage difference S has a height Ts in a direction perpendicular to the transparent thin film pattern 25 (in a direction of an arrow H). The height Ts of the stage difference S is determined by the following formula:

$$Ts=\lambda/\{2\cdot(n-1)\}$$

where $\lambda$ is an exposure wavelength and n is a refractive index of the transparent thin film. Since $\lambda$ is set to 365 nm and n is set to 1.68 in the present embodiment, Ts is 0.268 μm.

Then, the whole Si semiconductor substrate 21 is exposed for 140 msec (70 mJ/cm$^2$) by means of the i-line stepper having NA of 0.45 with the use of the transparent thin film pattern 25 as a phase shifter pattern (see FIG. 5).

In that case, the phase of exposed light transmitted through the transparent thin film pattern 25 is inverted to be the reverse to that of exposed light transmitted through a space area 26 between the transparent thin film patterns 25. Consequently, the amplitude of the exposed light transmitted through the pattern 25 and that of the exposed light transmitted through the area 26 cancel each other on the edge E of the pattern 25, so that the intensity of the exposed light on the edge E becomes zero. Accordingly, there is not exposed the resist layer 22 in the lower area L of the edge E of the pattern 25 in which the light intensity is zero. A resist layer portion 27 which is not exposed (see FIG. 6) remains as a fine resist mask pattern in the next step.

After the prebaking, development is carried out for 60 sec by using as a developer a diluted solution containing TMAH in similar to the formation of the transparent thin film pattern 25. Then, postbaking is carried out. Consequently, a fine resist mask pattern 27 is formed on the Si semiconductor substrate 21 in similar to the resist mask pattern 15 shown in FIG. 3 according to the first embodiment (see FIG. 6). The fine resist mask pattern 27 is comprised of a line D having a width of about 0.15 μm.

According to the present embodiment, there is formed a two-layer structure comprised of the resist layer 22 and the transparent thin film 23, and the transparent thin film pattern 25 is used as the phase shifter pattern. Consequently, there can be formed the fine resist mask pattern 27 comprised of the line D having a width of 0.15 μm. As a result, resolution can be enhanced by twice or more.

Third Embodiment

Figure 7:
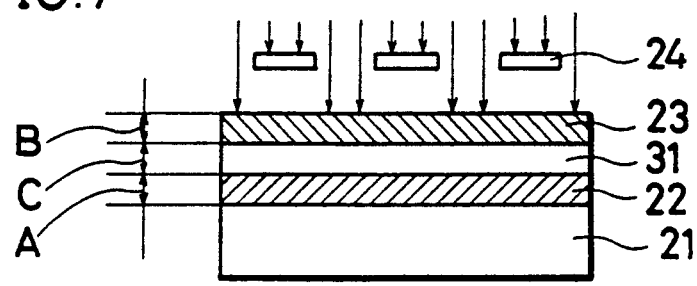
FIG. 7 is a view showing a first step of a manufacturing process according to a third embodiment of the present invention.
Figure 9:
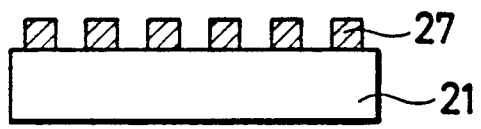
FIG. 9 is a view showing a third step of the manufacturing process according to the third embodiment of the present invention.
Figure 10:
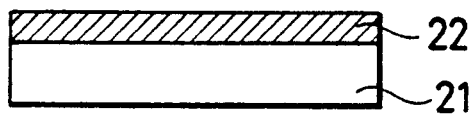
FIG. 10 is a view showing a first step of a manufacturing process according to a fourth embodiment of the present invention.
Figure 11:
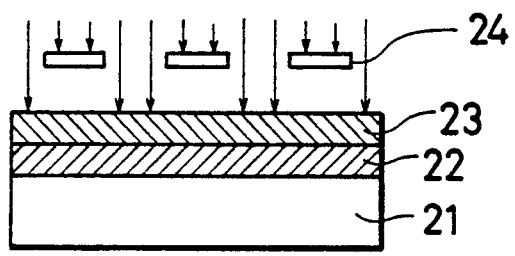
FIG. 11 is a view showing a second step of the manufacturing process according to the fourth embodiment of the present invention.

FIGS. 7 to 9 show a third embodiment of the present invention in which an intermediate layer (intermediate buffer layer) 31 is provided between a resist layer 22 and a phase shifter pattern, i.e., a thin film pattern 25 transparent for exposed light, the intermediate layer 31 being transparent for the exposed light and soluble in the developer of the resist layer 22.

In the case where a transparent thin film 23 is exposed by using a mask 24 so as to form the phase shifter pattern 25, the intermediate layer 31 is provided so that interference between the resist layer 22 and the transparent thin film 23 can be avoided.

As shown in FIG. 7, a Si semiconductor substrate 21 is subjected to a HMDS treatment. A spin on method is used and prebaking is then carried out. Consequently, a resist layer 22 is formed as a photosensitive region.

In that case, the prebaking is carried out for 60 sec at a temperature of 90° C. so that the resist layer 22 having a thickness A of 1.2 μm is formed.

Then, a water soluble barrier coating material, for example, polyvinyl alcohol is applied onto the whole resist layer 22 by the spin on method so as to form an intermediate layer 31.

In that case, the intermediate layer 31 having a thickness C of 0.08 μm is formed.

Subsequently, the spin on method is used and prebaking is then carried out. Consequently, a transparent thin film 23 is formed as a photosensitive resin over the intermediate layer 31 (see FIG. 7).

The prebaking is carried out for 60 sec at a temperature of 90° C. so that the transparent thin film 23 having a thickness B of 0.268 μm is formed.

Subsequently, the Si semiconductor substrate 21 is exposed for 140 msec (70 mJ/cm²) by means of an i-line stepper having NA of 0.45 with the use of a mask 24 which is provided in a predetermined position above the transparent thin film 23 (see FIG. 7).

After the prebaking, development is carried out by using a diluted solution containing TMAH. Postbaking is then carried out. The transparent thin film 23 is patterned to form a transparent thin film pattern (phase shifter pattern) 25 (see FIG. 8).

In that case, the postbaking is carried out for 90 sec at a temperature of 90° C. A stage difference S is formed on the transparent thin film pattern 25. The stage difference S has a height Ts in a direction perpendicular to the transparent thin film pattern 25 (in a direction of an arrow H). The height Ts of the stage difference S is determined by the following formula:

$$Ts = \lambda / \{2 \cdot (n-1)\}$$

where λ is an exposure wavelength and n is a refractive index of the transparent thin film. Since λ is set to 365 nm and n is set to 1.68 in the present embodiment, Ts is 0.268 μm.

Then, the whole Si semiconductor substrate 21 is exposed for 140 msec (70 mJ/cm²) which is not greater than a threshold exposure (Eth=200 msec) by means of the i-line stepper having NA of 0.45 with the use of the transparent thin film pattern 25 as a phase shifter pattern (see FIG. 8).

In that case, the phase of exposed light transmitted through the transparent thin film pattern 25 is inverted to be reverse to that of exposed light transmitted through a space area 26 between the transparent thin film patterns 25. Consequently, the amplitude of the exposed light transmitted through the pattern 25 and that of the exposed light transmitted through the area 26 cancel each other out on the edge E of the pattern 25, so that the intensity of the exposed light on the edge E becomes zero. Accordingly, there is not exposed a resist layer portion in the lower area L of the edge E of the pattern 25 in which the light intensity is zero. The resist layer portion which is not exposed remains as a fine resist mask pattern in the next step.

After the prebaking, development is carried out for 60 sec by using as a developer a diluted solution containing TMAH in similar to the formation of the transparent thin film pattern 25. Postbaking is then carried out to form a fine resist mask pattern 27 on the Si semiconductor substrate 21 (see FIG. 9). The fine resist mask pattern 27 is comprised of a line D having a width of about 0.15 μm.

According to the present embodiment, the intermediate layer 31 which is soluble in the developer is formed in order to avoid interference between the resist layer 22 and the transparent thin film 23 on which the phase shifter pattern 25 is formed.

Fourth Embodiment

FIGS. 10 to 13 show a fourth embodiment of the present invention in which the surface of a prebaked resist layer 22 is exposed to an alkali solution so as to form a developer insoluble layer (not shown) thereon, and a transparent thin film pattern 25 is then formed.

When the prebaked novolak resist layer 22 is exposed to the alkali solution, i.e., a diluted solution containing TMAH in a quantity of 2.38% as a developer before light exposure, a weak coupling reaction occurs between PAC (Photo Active Compound) and a resin in the resist layer 22. Consequently, the developer insoluble layer (not shown) is formed. The developer insoluble layer functions as the barrier layer of a transparent thin film 23 laminated on the resist layer 22 (see FIG. 11).

Fifth Embodiment

FIGS. 14 to 17 show a fifth embodiment of the present invention in which ultraviolet rays are radiated onto the surface of a prebaked resist layer 22 so that a developer insoluble layer (not shown) is formed thereon, and a transparent thin film 23 is then patterned on the developer insoluble layer so as to form a transparent thin film pattern 25.

When the ultraviolet rays are radiated onto the prebaked novolak resist layer 22 before exposure, a weak coupling reaction occurs between PAC and a resin in the resist layer 22. Consequently, the developer insoluble layer (not shown) is formed. The developer insoluble layer functions as the barrier layer of the transparent thin film 23 laminated on the resist layer 22 (see FIG. 15).

According to the present invention, the phase shifter pattern is formed on the upper part of the resist layer by means of a mask, an exposure device, a resist material and the like in accordance with the prior art. Consequently, a fine resist mask pattern can be formed by phase shifting effects on the semiconductor substrate. Consequently, actual resolution can be enhanced. The time and costs required for forming the pattern can be reduced. Furthermore, the present invention is more practical for a manufacturing process.

What is claimed is:

1. A method for forming a resist pattern by light exposure comprising the steps of:
    i) forming a resist layer having an upper surface on a semiconductor substrate,
    ii) forming a phase shifter pattern for inverting the phase of exposure light, said phase shifter pattern comprising convex forms in an upper portion of the resist layer itself,
    iii) exposing the whole upper surface of the resulting resist layer including the phase shifter pattern to form unexposed portions positioned below and adjacent to side walls of the convex forms of the phase shifter pattern, and
    iv) developing the resist layer, thereby forming a desired resist pattern having a width shorter than a wavelength of the exposure light.

2. The method for forming a resist pattern by light exposure according to claim 1 wherein forming the phase shifter pattern in the upper portion of the resist layer is conducted by light exposure using a mask provided above the resist layer.

3. A method for forming a resist pattern by light exposure comprising the steps of:
    i) forming a resist layer on a semiconductor substrate,
    ii) forming a phase shifter pattern for inverting the phase of exposure light, said phase shifter pattern comprising convex forms, over the resist layer,
    iii) exposing the resist layer including the phase shifter pattern to form unexposed portions in the resist layer which are below and adjacent to side walls of the convex forms of the phase shifter pattern,
    iv) developing the resultant resist layer to form a desired resist pattern having a width shorter than a wavelength of the exposure light.

4. The method for forming a resist pattern by light exposure according to claim 3, wherein the phase shifter pattern comprises a thin film pattern which is transparent to the exposure light.

5. The method for forming a resist pattern by light exposure according to claim 4, wherein the phase shifter pattern is formed after the thin film layer, which is transparent to the exposure light, is laminated over the surface of the resist layer.

6. The method for forming a resist pattern by light exposure according to claim 4, further comprising forming between the resist layer and the thin film, an intermediate layer which is transparent for the exposure light and is soluble in a developer for the resist layer.

7. The method for forming a resist pattern by light exposure according to claim 4, wherein the resist layer is made of a novolak resin, its surface is treated with a diluted developing solution and a film which is insoluble for the developing solution is then formed on the surface of the resist layer, and the phase shifter pattern is formed on the film which is insoluble for the developing solution.

8. The method for forming a resist pattern by light exposure according to claim 4, wherein the resist layer is made of a novolak resin, its surface is irradiated with ultraviolet rays and a film which is insoluble for the developing solution is then formed on the surface of the resist layer, and the phase shifter pattern is formed on the film which is insoluble for the developing solution.

* * * * *